United States Patent
Wang et al.

(10) Patent No.: US 7,556,748 B2
(45) Date of Patent: *Jul. 7, 2009

(54) METHOD OF MANUFACTURE OF SEMICONDUCTOR DEVICE AND CONDUCTIVE COMPOSITIONS USED THEREIN

(75) Inventors: Yueli Wang, Morrisville, NC (US); Richard John Sheffield Young, Bath (GB); Alan Frederick Carroll, Raleigh, NC (US); Kenneth Warren Hang, Hillsborough, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 267 days.

This patent is subject to a terminal disclaimer.

(21) Appl. No.: 11/106,329

(22) Filed: Apr. 14, 2005

(65) Prior Publication Data
US 2006/0231804 A1    Oct. 19, 2006

(51) Int. Cl.
*H01B 1/22* (2006.01)
(52) U.S. Cl. .................................... 252/514
(58) Field of Classification Search ............. 252/514; 106/1.19
See application file for complete search history.

(56) References Cited

U.S. PATENT DOCUMENTS

| 4,256,513 A | 3/1981 | Yoshida et al. |
| 4,737,197 A | 4/1988 | Nagahara et al. |
| 5,645,765 A | 7/1997 | Asada et al. |
| 2003/0108664 A1 | 6/2003 | Kodas et al. |
| 2004/0155227 A1* | 8/2004 | Bechtloff et al. ............ 252/500 |
| 2006/0231801 A1* | 10/2006 | Carroll et al. ............... 252/500 |

FOREIGN PATENT DOCUMENTS

| EP | 1465209 A1 | 6/2004 |
| JP | 11-330512 A | 11/1999 |
| JP | 2001-015782 A | 1/2001 |
| JP | 2001-127317 A | 5/2001 |
| JP | 2001-313400 A | 11/2001 |
| JP | 2003-223813 A | 8/2003 |
| JP | 2004-146521 A | 5/2004 |

\* cited by examiner

*Primary Examiner*—Mark Kopec

(57) ABSTRACT

The present invention is directed to a thick film conductive composition comprising: (a) electrically conductive silver powder; (b) Zn-containing additive wherein the particle size of said zinc-containing additive is in the range of 7 nanometers to less than 100 nanometers; (c) glass frit wherein said glass frit has a softening point in the range of 300 to 600° C.; dispersed in (d) organic medium.

The present invention is further directed to a semiconductor device and a method of manufacturing a semiconductor device from a structural element composed of a semiconductor having a p-n junction and an insulating film formed on a main surface of the semiconductor comprising the steps of (a) applying onto said insulating film the thick film composition as describe above; and (b) firing said semiconductor, insulating film and thick film composition to form an electrode.

5 Claims, 1 Drawing Sheet

METHOD OF MANUFACTURE OF SEMICONDUCTOR DEVICE AND CONDUCTIVE COMPOSITIONS USED THEREIN

FIELD OF THE INVENTION

This invention is directed primarily to a silicon semiconductor device. In particular, it is directed to a conductive silver paste for use in the front side of a solar cell device.

TECHNICAL BACKGROUND OF THE INVENTION

The present invention can be applied to a broad range of semiconductor devices, although it is especially effective in light-receiving elements such as photodiodes and solar cells. The background of the invention is described below with reference to solar cells as a specific example of the prior art.

A conventional solar cell structure with a p-type base has a negative electrode that is typically on the front-side or sun side of the cell and a positive electrode on the backside. It is well-known that radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metallized, i.e., provided with metal contacts that are electrically conductive.

Most electric power-generating solar cells currently used on earth are silicon solar cells. Process flow in mass production is generally aimed at achieving maximum simplification and minimizing manufacturing costs. Electrodes in particular are made by using a method such as screen printing to form a metal paste. An example of this method of production is described below in conjunction with FIG. 1. FIG. 1 shows a p-type silicon substrate, 10.

In FIG. 1(*b*), an n-type diffusion layer, 20, of the reverse conductivity type is formed by the thermal diffusion of phosphorus (P) or the like. Phosphorus oxychloride (POCl$_3$) is commonly used as the phosphorus diffusion source. In the absence of any particular modification, the diffusion layer, 20, is formed over the entire surface of the silicon substrate, 10. This diffusion layer has a sheet resistivity on the order of several tens of ohms per square ($\Omega/\square$), and a thickness of about 0.3 to 0.5 μm.

After protecting one surface of this diffusion layer with a resist or the like, as shown in FIG. 1(*c*), the diffusion layer, 20, is removed from most surfaces by etching so that it remains only on one main surface. The resist is then removed using an organic solvent or the like.

Next, a silicon nitride film, 30, is formed as an anti-reflection coating on the n-type diffusion layer, 20, to a thickness of about 700 to 900 Å in the manner shown in FIG. 1(*d*) by a process such as thermal chemical vapor deposition (CVD).

As shown in FIG. 1(*e*), a silver paste, 500, for the front electrode is screen printed then dried over the silicon nitride film, 30. In addition, a backside silver or silver/aluminum paste, 70, and an aluminum paste, 60, are then screen printed and successively dried on the backside of the substrate. Firing is then carried out in an infrared furnace at a temperature range of approximately 700 to 975° C. for a period of from several minutes to several tens of minutes.

Consequently, as shown in FIG. 1(*f*), aluminum diffuses from the aluminum paste into the silicon substrate, 10, as a dopant during firing, forming a p+ layer, 40, containing a high concentration of aluminum dopant. This layer is generally called the back surface field (BSF) layer, and helps to improve the energy conversion efficiency of the solar cell.

The aluminum paste is transformed by firing from a dried state, 60, to an aluminum back electrode, 61. The backside silver or silver/aluminum paste, 70, is fired at the same time, becoming a silver or silver/aluminum back electrode, 71. During firing, the boundary between the backside aluminum and the backside silver or silver/aluminum assumes an alloy state, and is connected electrically as well. The aluminum electrode accounts for most areas of the back electrode, owing in part to the need to form a p+ layer, 40. Because soldering to an aluminum electrode is impossible, a silver back electrode is formed over portions of the backside as an electrode for interconnecting solar cells by means of copper ribbon or the like. In addition, the front electrode-forming silver paste, 500, sinters and penetrates through the silicon nitride film, 30, during firing, and is thereby able to electrically contact the n-type layer, 20. This type of process is generally called "fire through." This fired through state is apparent in layer 501 of FIG. 1(*f*).

JP-A 2001-313400 to Shuichi et al., teaches a solar cell which is obtained by forming, on one main surface of a semiconductor substrate, regions that exhibit the other type of conductivity and forming an antireflection coating on this main surface of the semiconductor substrate. The resulting solar cell has an electrode material coated over the antireflection coating and fired. The electrode material includes, for example, lead, boron and silicon, and additionally contains, in a glass frit having a softening point of about 300 to 600° C., and one or more powders from among titanium, bismuth, cobalt, zinc, zirconium, iron, and chromium. These powders have an average particle size range from 0.1 to 5 μm. Shuichi et al. teaches that powders having an average particle size of less than 0.1 μm will have poor dispersibility inside the electrode, and the electrode will exhibit inadequate adhesive strength (tensile strength).

Although various methods and compositions for forming solar cells exist, there is an on-going effort to increase electrical performance and at the same time improve solder adhesion in solar cell applications. The present inventors desired to create a novel composition(s) and method of manufacturing a semiconductor device which improved both electrical performance and solder adhesion.

SUMMARY OF THE INVENTION

The present invention is directed to a thick film conductive composition comprising: (a) electrically conductive silver powder; (b) Zn-containing additive wherein the particle size of said zinc-containing additive is in the range of 7 nanometers to less than 100 nanometers; (c) glass frit wherein said glass frit has a softening point in the range of 300 to 600° C.; dispersed in (d) organic medium.

The present invention is further directed to a semiconductor device and a method of manufacturing a semiconductor device from a structural element composed of a semiconductor having a p-n junction and an insulating film formed on a main surface of the semiconductor comprising the steps of (a) applying onto said insulating film the thick film composition as describe above; and (b) firing said semiconductor, insulating film and thick film composition to form an electrode.

DETAILED DESCRIPTION OF THE INVENTION

Figure 1A:
FIG. 1 is a process flow diagram illustrating the fabrication of a semiconductor device.
Reference numerals shown in FIG. 1 are explained below.
10: p-type silicon substrate
20: n-type diffusion layer
30: silicon nitride film, titanium oxide film, or silicon oxide film
40: p+ layer (back surface field, BSF)
60: aluminum paste formed on backside
61: aluminum back electrode (obtained by firing backside aluminum paste)
70: silver or silver/aluminum paste formed on backside
71: silver or silver/aluminum back electrode (obtained by firing back side silver paste)
500: silver paste formed on front side
501: silver front electrode (formed by firing front side silver paste)

The main components of the thick film conductor composition(s) are electrically functional silver powders, zinc-containing additive, and glass frit dispersed in an organic medium. Additional additives may include metals, metal oxides or any compounds that can generate these metal oxides during firing. The components are discussed herein below.

I. Inorganic Components

The inorganic components of the present invention comprise (1) electrically functional silver powders; (2) Zn-containing additive(s); (3) glass frit; and optionally (4) additional metal/metal oxide additive selected from (a) a metal wherein said metal is selected from Ti, Mn, Sn, Pb, Ru, Co, Fe, Cu and Cr; (b) a metal oxide, MOx, wherein M is selected from Ti, Mn, Sn, Pb, Ru, Co, Fe, Cu and Cr; (c) any compounds that can generate the metal oxides of (b) upon firing; and (d) mixtures thereof.

A. Electrically Functional Silver Powders

Generally, a thick film composition comprises a functional phase that imparts appropriate electrically functional properties to the composition. The functional phase comprises electrically functional powders dispersed in an organic medium that acts as a carrier for the functional phase that forms the composition. The composition is fired to burn out the organic phase, activate the inorganic binder phase and to impart the electrically functional properties.

The functional phase of the composition may be coated or uncoated silver particles which are electrically conductive. When the silver particles are coated, they are at least partially coated with a surfactant. The surfactant may be selected from, but is not limited to, stearic acid, palmitic acid, a salt of stearate, a salt of palmitate and mixtures thereof. Other surfactants may be utilized including lauric acid, palmitic acid, oleic acid, stearic acid, capric acid, myristic acid and linolic acid. The counter-ion can be, but is not limited to, hydrogen, ammonium, sodium, potassium and mixtures thereof.

The particle size of the silver is not subject to any particular limitation, although an average particle size of no more than 10 microns, and preferably no more than 5 microns, is desirable. The silver powder accounts for 70 to 85 wt % of the paste composition, and generally 92 to 99 wt % of the solids in the composition (i.e., excluding the organic vehicle).

B. Zn-Containing Additive(s)

The Zn-containing additive of the present invention may be selected from (a) Zn, (b) metal oxides of Zn, (c) any compounds that can generate metal oxides of Zn upon firing, and (d) mixtures thereof. In addition, the Zn-containing additive has an average particle size of less than 0.1 μm. In particular the Zn-containing additive has an average particle size in the range of 7 nanometers to less than 100 nanometers.

C. Glass Frit

Examples of the glass frit compositions which may be used in the present invention include amorphous, partially crystallizable lead silicate glass compositions as well as other compatible glass frit compositions. In a further embodiment these glass frits are Cadmium-free. Some glass frit compositions useful in the present invention are detailed in Table 1 below.

TABLE 1

| | Glass Frit Compositions (Weight Percent Total Glass Composition) | | | | | | | | | | | |
|---|---|---|---|---|---|---|---|---|---|---|---|---|
| ID # | $SiO_2$ | $Al_2O_3$ | PbO | $B_2O_3$ | $CeO2$ | ZnO | $Na2O$ | Bi2O3 | $Li_2O$ | $TiO_2$ | CaO | CdO |
| 1 | 28.00 | 4.70 | 55.90 | 8.10 | | | | | | 3.30 | | |
| 2 | 26.06 | 6.69 | 50.96 | 8.94 | | 2.79 | | | | 4.56 | | |
| 3 | 23.37 | 0.41 | 59.75 | 7.93 | | 2.31 | | | 0.04 | 6.20 | | |
| 4 | 22.97 | 1.54 | 60.62 | 8.40 | | 2.46 | | | | 4.02 | | |
| 5 | 23.00 | 0.40 | 58.80 | 7.80 | | | | | | 6.10 | | 3.90 |
| 6 | 1.50 | | | 14.90 | 0.10 | | 1.0 | 81.5 | 1.0 | | | |

The glass compositions in weight % are shown in Table 1. Preferred cadmium-free glass compositions found in the examples comprise the following oxide constituents in the compositional range of: $SiO_2$ 21-29, $Al_2O_3$ 0.1-8, PbO 50-62, $B_2O_3$ 7-10, ZnO 0-4, $Li_2O$ 0-0.1, $TiO_2$ 2-7 in weight %. The more preferred composition of glass being: $SiO_2$ 28.00, $Al_2O_3$ 4.70, PbO 55.90, $B_2O_3$ 8.1, $TiO_2$ 3.30 in weight %.

Additionally, in a further embodiment, the glass frit composition is a lead-free composition. Some lead-free glass compositions useful in the present invention comprise the following oxide constituents in the compositional range of: $SiO_2$ 0.1-8, $Al_2O_3$ 0-4, $B_2O_3$ 8-25, CaO 0-1, ZnO 0-42, $Na_2O$ 0-4, $Li_2O$ 0-3.5, $Bi_2O_3$ 28-85, $Ag_2O$ 0-3 $CeO_2$ 0-4.5, $SnO_2$ 0-3.5, $BiF_3$ 0-15 in weight percent total glass composition.

An average particle size of the glass frit of the present invention is in the range of 0.5-1.5 μm in practical applications, while an average particle size in the range of 0.8-1.2 μm is preferred. The softening point of the glass frit (Tc: second transition point of DTA) should be in the range of 300-600° C. The amount of glass frit in the total composition is less than 4 wt. % of the total composition.

The glasses described herein are produced by conventional glass making techniques. More particularly, the glasses may be prepared as follows. Glasses are typically prepared in 500-1000 gram quantities. Typically, the ingredients are weighted, then mixed in the desired proportions, and heated in a bottom-loading furnace to form a melt in a platinum alloy crucible. Heating is typically conducted to a peak temperature (1000-1200° C.) and for a time such that the melt becomes entirely liquid and homogeneous. The glass melts are then quenched by pouring on the surface of counter rotating stainless steel rollers to form a 10-20 mil thick platelet of glass or by pouring into a water tank. The resulting glass platelet or water quenched frit is milled to form a powder with its 50% volume distribution set between 1-5 microns. The resulting glass powders are formulated with filler and medium into thick film pastes or castable dielectric compositions.

D. Additional Metal/Metal Oxide Additives

The additional metal/metal oxide additives of the present invention may be selected from (a) a metal wherein said metal is selected from Ti, Mn, Sn, Pb, Ru, Co, Fe, Cu and Cr, (b) a metal oxide MOx, wherein M is selected from Ti, Mn, Sn, Pb, Ru, Co, Fe, Cu and Cr, (c) any compounds that can generate the metal oxides of (b) upon firing, and (d) mixtures thereof.

The particle size of the additional metal/metal oxide additives is not subject to any particular limitation, although an average particle size of no more than 10 microns, and preferably no more than 5 microns, is desirable.

In one embodiment, the particle size of the metal/metal oxide additive is in the range of 7 nanometers (nm) to 125 nm. In particular, $MnO_2$ and $TiO_2$ may be utilized in the present invention with an average particle size range ($d_{50}$) of 7 nanometers (nm) to 125 nm.

The range of the metal/metal oxide additives and Zn-containing additive in the composition is 0.1 wt. % to 6 wt. % in the total composition.

Oxides such as MnOx and Cu/CuOx, as well as other oxides, may also aid in adhesion to some degree.

E. Organic Medium

The inorganic components are typically mixed with an organic medium by mechanical mixing to form viscous compositions called "pastes", having suitable consistency and rheology for printing. A wide variety of inert viscous materials can be used as organic medium. The organic medium must be one in which the inorganic components are dispersible with an adequate degree of stability. The rheological properties of the medium must be such that they lend good application properties to the composition, including: stable dispersion of solids, appropriate viscosity and thixotropy for screen printing, appropriate wettability of the substrate and the paste solids, a good drying rate, and good firing properties. The organic vehicle used in the thick film composition of the present invention is preferably a nonaqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 8 wt. % to 11 wt. % of the total composition. The thick film silver composition of the present invention may be adjusted to a predetermined, screen-printable viscosity with the organic medium.

The ratio of organic medium in the thick film composition to the inorganic components in the dispersion is dependent on the method of applying the paste and the kind of organic medium used, and it can vary. Usually, the dispersion will contain 70-95 wt % of inorganic components and 5-30 wt % of organic medium (vehicle) in order to obtain good wetting.

Description of Method of Manufacturing a Semiconductor Device

Accordingly, the invention provides a novel composition(s) that may be utilized in the manufacture of a semiconductor device. The semiconductor device may be manufactured by the following method from a structural element composed of a junction-bearing semiconductor substrate and a silicon nitride insulating film formed on a main surface thereof. The method of manufacture of a semiconductor device includes the steps of applying (typically, coating and printing) onto the insulating film, in a predetermined shape and at a predetermined position, the conductive thick film composition of the present invention having the ability to penetrate the insulating film, then firing so that the conductive thick film composition melts and passes through the insulating film, effecting electrical contact with the silicon substrate. The electrically conductive thick film composition is a thick-film paste composition, as described herein, which is made of a silver powder, Zn-containing additive, a glass or glass powder mixture having a softening point of 300 to 600° C., dispersed in an organic vehicle and optionally, additional metal/metal oxide additive(s).

The composition has a glass powder content of less than 5% by weight of the total composition and a Zn-containing additive combined with optional additional metal/metal oxide additive content of no more than 6% by weight of the total composition. The invention also provides a semiconductor device manufactured from the same method.

The invention may also be characterized by the use of a silicon nitride film or silicon oxide film as the insulating film. The silicon nitride film is typically formed by a plasma chemical vapor deposition (CVD) or thermal CVD process. The silicon oxide film is typically formed by thermal oxidation, thermal CFD or plasma CFD.

The method of manufacture of the semiconductor device may also be characterized by manufacturing a semiconductor device from a structural element composed of a junction-bearing semiconductor substrate and an insulating film formed on one main surface thereof, wherein the insulating layer is selected from a titanium oxide silicon nitride, SiNx:H, silicon oxide, and silicon oxide/titanium oxide film, which method includes the steps of forming on the insulating film, in a predetermined shape and at a predetermined position, a metal paste material having the ability to react and penetrate the insulating film, forming electrical contact with the silicon substrate. The titanium oxide film is typically formed by coating a titanium-containing organic liquid material onto the semiconductor substrate and firing, or by a thermal CVD. The silicon nitride film is typically formed by PECVD (plasma enhanced chemical vapor deposition). The invention also provides a semiconductor device manufactured from this same method.

The electrode formed from the conductive thick film composition(s) of the present invention is typically fired in an atmosphere that is preferably composed of a mixed gas of oxygen and nitrogen. This firing process removes the organic medium and sinters the glass frit with the Ag powder in the conductive thick film composition. The semiconductor substrate is typically single-crystal or multicrystalline silicon.

FIG. 1(a) shows a step in which a substrate of single-crystal silicon or of multicrystalline silicon is provided typically, with a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 μm of the substrate surface using an aqueous alkali solution such as aqueous potassium hydroxide or aqueous sodium hydroxide, or using a mixture of hydrofluoric acid and nitric acid. In addition, a step in which the substrate is washed typically with a mixture of hydrochloric acid and hydrogen peroxide may be added to remove heavy metals such as iron adhering to the substrate surface. An antireflective textured surface is sometimes formed thereafter using, for example, an aqueous alkali solution such as aqueous potassium hydroxide or aqueous sodium hydroxide. This gives the substrate, 10.

Figure 1B:
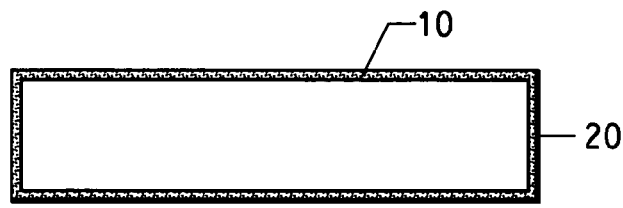
Figure 1C:

Next, referring to FIG. 1(b), when the substrate used is a p-type substrate, an n-type layer is formed to create a p-n junction. The method used to form such an n-type layer may be phosphorus (P) diffusion using phosphorus oxychloride ($POCl_3$). The depth of the diffusion layer in this case can be varied by controlling the diffusion temperature and time, and is generally formed within a thickness range of about 0.3 to 0.5 μm. The n-type layer formed in this way is represented in the diagram by reference numeral 20. Next, p-n separation on the front and backsides may be carried out by the method described in the background of the invention. These steps are not always necessary when a phosphorus-containing liquid coating material such as phosphosilicate glass (PSG) is applied onto only one surface of the substrate by a process, such as spin coating, and diffusion is effected by annealing under suitable conditions. Of course, where there is a risk of an n-type layer forming on the backside of the substrate as well, the degree of completeness can be increased by employing the steps detailed in the background of the invention.

Figure 1D:
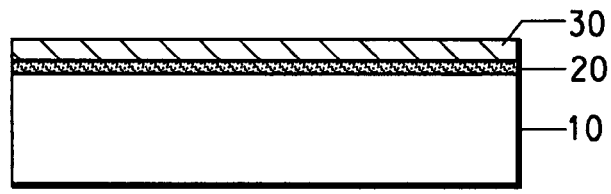

Next, in FIG. 1(d), a silicon nitride film or other insulating films including SiNx:H (i.e., the insulating film comprises hydrogen for passivation) film, titanium oxide film, and silicon oxide film, 30, which functions as an antireflection coating is formed on the above-described n-type diffusion layer, 20. This silicon nitride film, 30, lowers the surface reflectance of the solar cell to incident light, making it possible to greatly increase the electrical current generated. The thickness of the silicon nitride film, 30, depends on its refractive index, although a thickness of about 700 to 900 Å is suitable for a refractive index of about 1.9 to 2.0. This silicon nitride film may be formed by a process such as low-pressure CVD, plasma CVD, or thermal CVD. When thermal CVD is used, the starting materials are often dichlorosilane ($SiCl_2H_2$) and ammonia ($NH_3$) gas, and film formation is carried out at a temperature of at least 700° C. When plasma CVD is used, pyrolysis of the starting gases at the high temperature results in the presence of substantially no hydrogen in the silicon nitride film, giving a compositional ratio between the silicon and the nitrogen of $Si_3N_4$ which is substantially stoichiometric. The refractive index falls within a range of substantially 1.96 to 1.98. Hence, this type of silicon nitride film is a very dense film whose characteristics, such as thickness and refractive index, remain unchanged even when subjected to heat treatment in a later step. The starting gas used when film formation is carried out by plasma CVD is generally a gas mixture of $SiH_4$ and $NH_3$. The starting gas is decomposed by the plasma, and film formation is carried out at a temperature of 300 to 550° C. Because film formation by such a plasma CVD process is carried out at a lower temperature than thermal CVD, the hydrogen in the starting gas is present as well in the resulting silicon nitride film. Also, because gas decomposition is effected by a plasma, another distinctive feature of this process is the ability to greatly vary the compositional ratio between the silicon and nitrogen. Specifically, by varying such conditions as the flow rate ratio of the starting gases and the pressure and temperature during film formation, silicon nitride films can be formed at varying compositional ratios between silicon, nitrogen and hydrogen, and within a refractive index range of 1.8 to 2.5. When a film having such properties is heat-treated in a subsequent step, the refractive index may change before and after film formation due to such effects as hydrogen elimination in the electrode firing step. In such cases, the silicon nitride film required in a solar cell can be obtained by selecting the film-forming conditions after first taking into account the changes in film qualities that will occur as a result of heat treatment in the subsequent step.

In FIG. 1(d), a titanium oxide film may be formed on the n-type diffusion layer, 20, instead of the silicon nitride film, 30, functioning as an antireflection coating. The titanium oxide film is formed by coating a titanium-containing organic liquid material onto the n-type diffusion layer, 20, and firing, or by thermal CVD. It is also possible, in FIG. 1(d), to form a silicon oxide film on the n-type diffusion layer, 20, instead of the silicon nitride film 30 functioning as an antireflection layer. The silicon oxide film is formed by thermal oxidation, thermal CVD or plasma CVD.

Figure 1E:
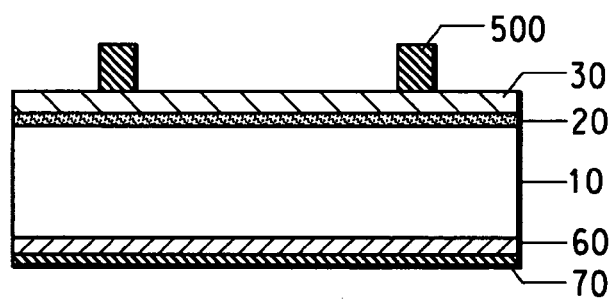
Figure 1F:
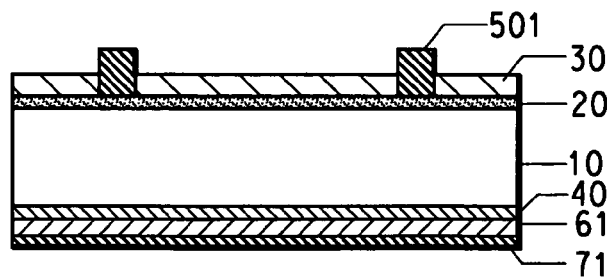

Next, electrodes are formed by steps similar to those shown in FIGS. 1(e) and (f). That is, as shown in FIG. 1(e), aluminum paste, 60, and back side silver paste, 70, are screen printed onto the backside of the substrate, 10, as shown in FIG. 1(e) and successively dried. In addition, a front electrode-forming silver paste is screen printed onto the silicon nitride film, 30, in the same way as on the backside of the substrate, 10, following which drying and firing are carried out in an infrared furnace at typically at a temperature range of 700 to 975° C. for a period of from several minutes to more than ten minutes while passing through the furnace a mixed gas stream of oxygen and nitrogen.

As shown in FIG. 1(*f*), during firing, aluminum diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a p+ layer, 40. At the same time, because soldering to an aluminum electrode is impossible, the silver or silver/aluminum back electrode is formed on limited areas of the back side as an electrode for interconnecting solar cells by means of copper ribbon or the like.

On the front side, the front electrode silver paste, 500, of the invention is composed of silver, Zn-containing additive, glassfrit, organic medium and optional metal oxides, and is capable of reacting and penetrating through the silicon nitride film, 30, during firing to achieve electrical contact with the n-type layer, 20 (fire through). This fired-through state, i.e., the extent to which the front electrode silver paste melts and passes through the silicon nitride film, 30, depends on the quality and thickness of the silicon nitride film, 30, the composition of the front electrode silver paste, and on the firing conditions. The conversion efficiency and moisture resistance reliability of the solar cell clearly depend, to a large degree, on this fired-through state.

EXAMPLES

The thick film composition(s) of the present invention are described herein below in Examples 1-25.

Glass Preparation:

The glass composition(s) utilized in the Examples are detailed below in Table 2 and identified in Table 3.

Paste Preparation:

Paste preparations were, in general, accomplished with the following procedure: The appropriate amount of solvent, medium and surfactant was weighed then mixed in a mixing can for 15 minutes, then glass frits and metal additives were added and mixed for another 15 minutes. Since Ag is the major part of the solids of the present invention, It was added incrementally to ensure better wetting. When well mixed, the paste was past through a 3-roll mill for a few times, under pressures from 0 to 400 psi. The gap of the rolls were adjusted to 1 mil. The degree of dispersion was measured by fineness of grind (FOG). A typical FOG value is generally equal to or less than 20/15 for conductors.

TABLE 3

Examples 1-25 Silver and Glass Compositions in Weight Percent of Total Composition

| Example Number | Ag (wt %) | Glass I (wt %) | Glass II (wt %) | Glass III (wt %) | Glass IV (wt %) | Glass VI |
|---|---|---|---|---|---|---|
| 1 | 80 | 2.0 | 0 | 0 | 0 | 0 |
| 2 | 80.95 | 2.0 | 0 | 0 | 0 | 0 |
| 3 | 80 | | 0.5 | 0 | 0 | 0 |
| 4 | 80.95 | 1.5 | 0.5 | 0 | 0 | 0 |
| 5 | 79.5 | 2.0 | 0.5 | 0 | 0 | 0 |
| 6 | 80 | 2.0 | 0 | 0 | 0 | 0 |
| 7 | 80 | 2.0 | 0 | 0 | 0 | 0 |
| 8 | 80 | 2.0 | 0 | 0 | 0 | 0 |
| 9 | 80.45 | 0 | 2.5 | 0 | 0 | 0 |
| 10 | 80.45 | 0 | 2.5 | 0 | 0 | 0 |
| 11 | 80.35 | 0 | 2.5 | 0 | 0 | 0 |
| 12 | 80.75 | 1.5 | 0.5 | 0 | 0 | 0 |
| 13 | 79.5 | 0 | 2.5 | 0 | 0 | 0 |
| 14 | 79.0 | 2.0 | 0 | 0 | 0 | 0 |
| 15 | 79.45 | 0 | 2.5 | 0 | 0 | 0 |
| 16 | 80.35 | 0 | 0 | 2.5 | 0 | 0 |
| 17 | 81.95 | 0 | 0 | 0 | 0 | 0 |
| 18 | 84.45 | 0 | 0 | 0 | 2 | 0 |
| 19 | 80.0 | 0 | 2.0 | 0 | 0 | 0 |
| 20 | 80.45 | 2.0 | 0.5 | 0 | 0 | 0 |
| 21 | 79 | 0 | 0 | 0 | 0 | 1.4 |
| 22 | 80 | 2.0 | 0 | 0 | 0 | 0 |
| 23 | 80 | 2.0 | 0 | 0 | 0 | 0 |
| 24 | 80 | 2.0 | 0 | 0 | 0 | 0 |
| 25 | 80 | 2.0 | 0 | 0 | 0 | 0 |

* Each of the Examples 1-25 contain 12 wt. % solvent (Texanol ®), 1.1 wt. % ethyl cellulose and 0.8 wt. % surfactant (soya lecithin).

TABLE 2

Glass Compositions in Weight Percent of Total Glass Composition

| | Glass Composition in Weight Percent | | | | | | | | | | ASTM Softening Pt. (° C.) | TMA Onset (° C.) |
|---|---|---|---|---|---|---|---|---|---|---|---|---|
| | SiO2 | Na2O | Li2O | Bi2O3 | CeO2 | Al2O3 | PbO | B2O3 | TiO2 | ZnO | | |
| Glass I | 28.00 | | | | | 4.70 | 55.90 | 8.10 | 3.30 | | 600 | 502 |
| Glass II | 6.00 | | | | | | 80.50 | 12.00 | | 1.50 | 430 | 365 |
| Glass III | 1.64 | | | | | 1.73 | 85.76 | 10.86 | | | 362 | 322 |
| Glass IV | 9.10 | | | | | 1.40 | 77.0 | 12.50 | | | 395 | 361 |
| Glass V | 1.77 | | | | | | 82.32 | 8.73 | 1.18 | 6.00 | — | 340 |
| Glass VI | 1.50 | 1.0 | 1.0 | 81.50 | 0.10 | | | 14.90 | | | — | — |

TABLE 4

Examples 1-20 Metal, Metal Resinate Compositions in Weight Percent of Total Composition

| Example Number | ZnO | ZnO fine | Zn metal | TiO2 | TiO2 fine | MnO2 | Tyzor | Mn Resinate | Zn Resinate | Cu | Eff % | Adhesion |
|---|---|---|---|---|---|---|---|---|---|---|---|---|
| 1 | 4.45 | 0 | 0 | 0 | 0 | 0 | 0 | 0 | 0 | 0 | 15.3 | good |
| 2 | 0 | 3.50 | 0 | 0 | 0 | 0 | 0 | 0 | 0 | 0 | 15.6 | good |
| 3 | 4.45 | 0 | 0 | 0 | 0 | 0 | 0 | 0 | 0 | 0 | 15.4 | good |
| 4 | 0 | 3.50 | 0 | 0 | 0 | 0 | 0 | 0 | 0 | 0 | 15.4 | good |
| 5 | 4.45 | 0 | 0 | 0 | 0 | 0 | 0 | 0 | 0 | 0 | 15.4 | good |
| 6 | 4.45 | 0 | 0 | 1.0 | 0 | 0 | 0 | 0 | 0 | 0 | 15.3 | adequate |
| 7 | 4.45 | 0 | 0 | 0 | 0 | 0 | 1.0 | 0 | 0 | 0 | 15.4 | good |
| 8 | 4.45 | 0 | 0 | 0 | 0 | 0 | 0 | 1.0 | 0 | 0 | 15.1 | good |
| 9 | 0 | 3.50 | 0 | 0 | 0 | 0 | 0 | 0 | 0 | 0 | 15.4 | v good |
| 10 | 0 | 3.50 | 0 | 0 | 0.1 | 0 | 0 | 0 | 0 | 0 | >15.6 | good |
| 11 | 0 | 3.50 | 0 | 0 | 0 | 0 | 0 | 0 | 0 | 0.2 | 15.6 | excellent |
| 12 | 4.45 | 0 | 0 | 0 | 0 | 0 | 0 | 0 | 2 | 0 | >15.3 | good |
| 13 | 4.45 | 0 | 0 | 0 | 0 | 1.0 | 0 | 0 | 0 | 0 | >15 | good |
| 14 | 0 | 0 | 0 | 0 | 0 | 4.50 | 0 | 0 | 0 | 0 | >15 | good |
| 15 | 0 | 3.5 | 0 | 0 | 0.1 | 0 | 0 | 0 | 0 | 0 | ~15 | v good |
| 16 | 0 | 3.5 | 0 | 0 | 0 | 0 | 0 | 0 | 0 | 1.0 | >10 | adequate |
| 17 | 0 | 0 | 0 | 0 | 0 | 0 | 0 | 0 | 0 | 0 | ~4 | not tested |
| 18 | 4.45 | 0 | 0 | 0 | 0 | 0 | 0 | 0 | 0 | 0 | ~15 | good |
| 19 | 0 | 0 | 4.45 | 0 | 0 | 0 | 0 | 0 | 0 | 0 | 14.7 | adequate |
| 20 | 0 | 3.5 | 0 | 0 | 0.1 | 0 | 0 | 0 | 0 | 0.2 | 15.7 | V good |
| 21 | 6.5 | 0 | 0 | 0 | 0 | 0 | 0 | 0 | 0 | 0 | ~15 | V good |

Each of the Examples 1-20 contain 12 wt. % solvent (Texanol ®), 1.1 wt. % ethyl cellulose and 0.8 wt. % surfactant soya lecithin.
** The ZnO fine is commercially available from US Zinc Corporation with average particle sizes of 7 nm and 30 nm.
*** The Zn resinate is commercially available from OMG Americas, as ZINC TEN-CEM.

TABLE 5

Examples 22-25, Metal Oxide Compositions in Weight Percent of Total Composition, and Their Solar Cell Properties

| Example | TiO2 | Co3O4 | Fe2O3 | Cr2O3 | Eff % | Adhesion |
|---|---|---|---|---|---|---|
| 22 | | | 4.45 | | <5 | NT |
| 23 | | | | 4.45 | <5 | NT |
| 24 | | 4.45 | | | <5 | NT |
| 25 | 4.50 | | | | <5 | NT |

NT: Not tested

Test Procedure-Efficiency

The solar cells built according to the method described above were placed in a commercial IV tester for measuring efficiencies. The light bulb in the IV tester simulated the sunlight with a known intensity and radiated the front surface of the cell, the bus bars printed in the front of the cell were connected to the multiple probes of the IV tester and the electrical signals were transmitted through the probes to the computer for calculating efficiencies.

Test Procedure-Adhesion

After firing, a solder ribbon (copper coated with 62 Sn/36 Pb/2 Ag) was soldered to the bus bars printed on the front of the cell. Solder condition was typically at 345° C. for 5 seconds. Flux used was mildly activated alpha-611 or not activated multicore 100. The soldered area was approximately 2 mm×2 mm. The adhesion strength was obtained by pulling the ribbon at an angle of 90° to the surface of the cell. An assessment of the adhesion strength was assigned as adequate, good, very good, or excellent, based on the assumption that an adhesion strength less than 400 g is considered not good; values in the range of 400 g to less than 600 g were assessed as adequate adhesion strength; equal to or greater than 600 g is considered good, very good, or excellent adhesion strength.

For the compositions using Pb free frit, we tested adhesion using both Pb free solder and Pb containing solder. Pb free solder used is 96.5 Sn/3.5 Ag. Solder temperature for the Pb free solder is 375° C., solder time is 5-7 s. Flux used is MF200. Adhesion obtained is typically above 600 g.

Additionally, after pulling, the solder joint was examined under a microscope for failure mode. If more than 50% of the soldered area showed Si fracture, it was considered a very good failure mode.

What is claimed is:

1. A thick film conductive composition comprising:
   a) electrically conductive silver powder;
   b) zinc-containing additive wherein the particle size of said zinc-containing additive is in the range of 7 nanometers to less than 30 nanometers, and wherein the zinc-containing additive is ZnO;
   c) one or more glass frits.; dispersed in
   d) organic medium.

2. The composition of claim 1 further comprising an additional metal/metal oxide additive selected from the group consisting of (a) a metal wherein said metal is selected from the group consisting of Ti, Mn, Sn, Pb, Ru, Go, Fe, Cu and Cr; (b) a metal oxide, MOx, wherein M is selected from the group consisting of Ti, Mn, Sn, Pb, Ru, Go, Fe, Cu and Cr; (c) any compounds that can generate a metal oxide, MOx, upon firing, wherein M is selected from the group consisting of Ti, Mn, Sn, Pb, Ru, Go, Fe, Cu and Cr and (d) mixtures of (a), (b) and (c).

3. The composition of claim 1 wherein said glass frit composition comprises, based on weight percent total glass frit composition: $SiO_2$ 21-29, $Al_2O_3$ 0.1-8, PbO 50-62, $B_2O_3$ 7-10, ZnO 0-4, $Li_2O$ 0-0.1, and $TiO_2$ 2-7.

4. The composition of claim 1 wherein said glass frit is a lead-free glass frit comprising, based on weight percent total glass frit composition, $SiO_2$ 0.1-8, $Al_2O_3$ 0-4, $B_2O_3$ 8-25, CaO 0-1, ZnO 0-42, $Na_2O$ 0-4, $Li_2O$ 0-3.5, $Bi_2O_3$ 28-85, $Ag_2O$ 0-3 $CeO_2$ 0-4.5, $SnO_2$ 0-3.5, and $BiF_3$ 0-15.

5. The composition of claim 1, wherein the glass frit is a lead-free glass frit.

* * * * *